United States Patent
Muza

(10) Patent No.: US 6,304,135 B1
(45) Date of Patent: Oct. 16, 2001

(54) TUNING METHOD FOR $G_M/C$ FILTERS WITH MINIMAL AREA OVERHEAD AND ZERO OPERATIONAL CURRENT PENALTY

(75) Inventor: John Matthew Muza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/441,496

(22) Filed: Nov. 17, 1999

(51) Int. Cl.[7] ....................................... H03K 5/00
(52) U.S. Cl. ........................... 327/553; 327/552; 327/554
(58) Field of Search .................................. 327/551, 552, 327/553, 538, 539, 540, 541, 554

(56) References Cited

U.S. PATENT DOCUMENTS 5,606,277 * 2/1997 Feliz ...................................... 327/311

* cited by examiner

Primary Examiner—Tuan T. Lam
Assistant Examiner—Hiep Nguyen
(74) Attorney, Agent, or Firm—April M. Mosby; W. James Brady; Frederick J. Telecky, Jr.

(57) ABSTRACT

A method and circuit (40) for tuning a $G_m/C$ filter. A first circuit portion includes a variable current source (52) having a plurality of transistors M15 through M20 coupled to switches SWA through $SW_{MAX}$. The output capacitor $C_{INT}$ is calibrated iteratively by compensating a calibration capacitor $C_{INTC}$ with the variable current source to tune the $G_m/C$ filter. The transconductance $G_m$ is dependent on a precision external resistor $R_{ext}$ rather than on internal resistors of the $G_m/C$ filter. An algorithm (74) performs the iterative calibrations for the $G_m/C$ filter. The invention is particularly useful for mixed signal or analog circuits.

6 Claims, 3 Drawing Sheets

US 6,304,135 B1

TUNING METHOD FOR $G_M/C$ FILTERS WITH MINIMAL AREA OVERHEAD AND ZERO OPERATIONAL CURRENT PENALTY

TECHNICAL FIELD OF THE INVENTION

This invention relates generally to the field of electronic amplifier circuits, and more particularly to a tuning method and circuit for a $G_m/C$ filter circuit.

BACKGROUND OF THE INVENTION

The recent trend towards the miniaturization of electronic circuits is driven by consumer demand for smaller and light-weight electronic devices such as cellular phones and portable computers. Often, the heaviest component in an electronic device is the battery. Smaller batteries are able to provide less power. As batteries become smaller, integrated circuits (ICs) need lower working voltages and power consumption to prevent the battery from discharging too rapidly. As appliances and circuit designs continue to decrease in size and increase in speed, the need for low power, low noise, current efficient filter circuits increases.

One configuration for a continuous time filter having a transconductor needs tuning to accommodate for resistive/capacitive (RC) effects and components of the circuitry. Transconductance ($G_m$) is defined as the proportionality constant that is a function of the output signal current component and the instantaneous input voltage of the transconductor.

SUMMARY OF THE INVENTION

The present invention achieves technical advantages as a tuning method and circuit for $G_m/C$ filters. The circuit and method is useful in a variety of applications, particularly in amplifier circuits for small portable electronic devices such as cellular phones and laptop computers.

In one embodiment, disclosed is a method of tuning a $G_m/C$ filter having a transconductive $G_m$ stage and an output capacitor, the $G_m/C$ filter having a first circuit portion including a variable current source. The method includes the step of calibrating the output capacitor iteratively with the variable current source to tune the $G_m/C$ filter.

In another embodiment, disclosed is a method of tuning a $G_m/C$ filter having a transconductance $G_m$ stage and an output capacitor, including the step of establishing a bias current with an external precision resistor, where the transconductance $G_m$ of the $G_m/C$ filter is a function of the external precision resistor. The bias current is scaled with a scaling factor adapted to calibrate the $G_m/C$ circuit output capacitor.

Also disclosed is a $G_m/C$ filter and tuning circuit therefore having a transconductance and a capacitor, including a first circuit portion adapted to couple to the filter and iteratively tune the capacitance of the filter capacitor.

The present invention is advantageous in providing a tuning circuit and method that shuts off once the $G_m$ and $C_{INT}$ components are calibrated, requiring no operational current, saving power and thereby increasing battery life. This is advantageous over prior art PLL-type tuning circuits that require continuous current. Also, the circuits of the present invention require very little semiconductor area, compared to other tuning schemes which require large cells. Very little additional circuitry is required with most of the circuits already existing in a typical $G_m/C$ filter. A circuit including an op amp, a variable current source block, and an algorithm in the digital circuitry are the only additional components of the present invention. Furthermore, the on-chip algorithm and circuit for tuning a $G_m/C$ filter described has no detrimental dynamic effects on the filter circuitry, and tuning is completed in fewer clock cycles than in prior art circuits.

BRIEF DESCRIPTION OF THE DRAWINGS

In the drawings, which form an integral part of the specification and are to be read in conjunction therewith.

Like numerals and symbols are employed in different figures to designate similar components in various views unless otherwise indicated.

DETAILED DESCRIPTION OF PREFERRED EMBODIMENTS

Prior art circuit designs of $G_m/C$ filters utilize an on-chip continuously-running phase lock loops (PLLs), voltage controlled oscillators (VCOs), and extra master filters for frequency tuning. These prior art tuning circuits use a large amount of power and semiconductor area. Also, they tend to be highly complex and less robust in actual use.

The present invention includes a method and circuit for tuning a transconductance/capacitance ($G_m/C$) filter having minimal surface area overhead and zero operational current penalty. The impact of processing variations are eliminated by tuning both the transconductance $G_m$ and capacitance C variations separately. A method and circuit for tuning the transconductance $G_m$ will first be discussed, followed by a method and circuit for tuning the capacitance C of a $G_m/C$ filter.

Figure 1:
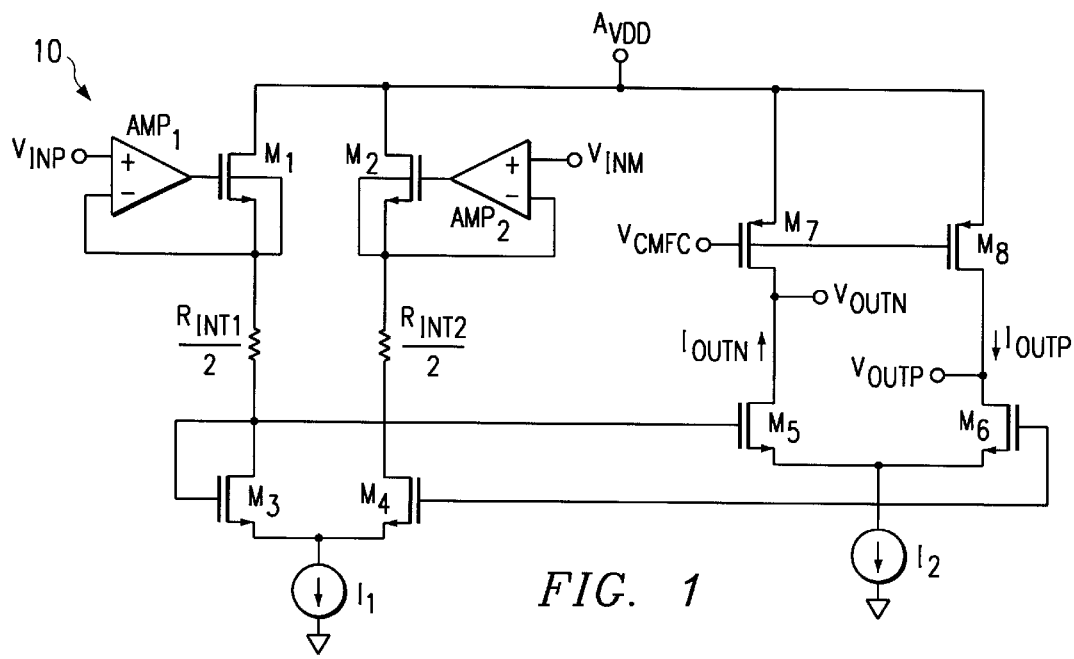
FIG. 1 shows a gain cell $G_m$ stage of the present invention.

A preferred transconductive $G_m$ stage of the present invention is generally shown in the circuit of FIG. 1. The circuit illustrates a transconductor stage 10 of a $G_m/C$ gain cell filter having two differential amplifiers Amp1 and Amp 2 coupled to transistors M7 and M8 and coupled to an internal resistance represented by $R_{INT1}/2$ and $R_{INT2}/2$, respectively. The internal resistors $R_{INT1}/2$ and $R_{INT2}/2$ are coupled to transistors M1 and M2, respectively. The sources of transistors M1 and M2 are coupled to a first current source $I_1$. Transistor M5 and M6 sources are coupled to positive voltage rail $A_{VDD}$ and are driven by a common mode feedback control voltage $V_{CMFC}$. The drain of transistor M1 is controllably coupled to the gate of transistor M3, and the drain of transistor M2 is controllably coupled to the gate of transistor M4. The sources of transistors M3 and M4 are coupled to a second current source $I_2$. Output voltages $V_{OUTP}$ and $V_{OUTP}$ are generated at the drains of transistors M4 and M3, respectively. The voltage $V_{CMFC}$ provides a feedback loop through transistors M5 and M6 such that $(V_{OUTP}+V_{OUTM})/2=x$, where x is a fixed value. Resistors $R_{INT1}$, and $R_{INT2}$ comprise on-chip resistors configured so that the transconductance $G_m$ of the circuit 10 is a linear resistance value, $1/R_{INT}$ where $R_{INT1}=R_{INT1}/2+R_{INT2}/2$. The differential input/output transconductance $G_m$ of the circuit 10 of FIG. 1 is equal to:

$$G_m = \frac{1}{R_{INT}}\left(\frac{I_2}{I_1}\right)$$

Equation 1
where $$R_{INT}=R_{INT1}/2+R_{INT2}/2.$$

Figure 2:
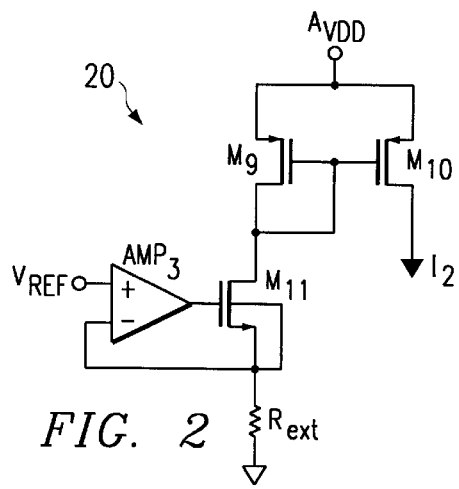
FIGS. 2 and 3 show tuning circuits for generating currents $I_1$ and $I_2$, canceling out the variation of the internal resistor $R_{INT}$.
Figure 3:
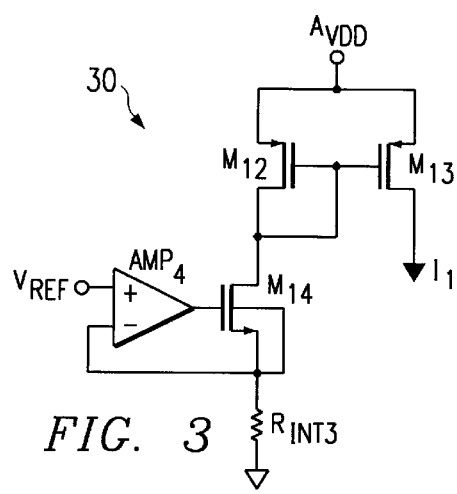

FIGS. 2 and 3 illustrate exemplary circuits and methods for generating current sources $I_1$ and $I_2$ to eliminate transconductance $G_m$ resistive variations of a $G_m/C$ filter in a preferred embodiment of the present invention. Referring first to the circuit 20 of FIG. 2, amplifier Amp3 has an input voltage $V_{ref}$ being a DC voltage. Amplifier Amp3 is controllably coupled to transistor M13. Amplifier Amp3 and $V_{ref}$ are coupled through precision external resistor $R_{ext}$ to ground. Precision resistor $R_{ext}$ is used to set the very well controlled chip bias current $I_2$ of FIG. 1. The drain of transistor M11 is coupled to the gates of transistors M9 and M10, the sources of transistors M9 and M10 being coupled to supply voltage $A_{VDD}$. Current $I_2$ generated at the drain of transistor M10 and is the main bias current for the entire chip or circuit 10 of FIG. 10. Current $I_2$ is equal to $V_{ref}/R_{ext}$.

Referring next to the circuit 30 of FIG. 3, amplifier Amp4 is coupled in a similar set up to transistor M14, resistor $R_{INT3}$, transistors M12 and M13, with current $I_1$, being generated at the drain of transistor M13 and being equal to $V_{ref}/R_{INT3}$. The current ratios $I_2/I_1$ are used advantageously herein, by making current $I_2$ based off the precision resistor $R_{ext}$ and making current $I_1$ based off the internal resistor $R_{INT3}$. Preferably, voltage $V_{ref}$ is a DC voltage with a bandgap that is derived or externally given. Substituting the values of currents $I_1$ and $I_2$ into Equation 1 yields Equation 2 below.

$$G_m = \frac{1}{R_{INT}}\left(\frac{\frac{V_{ref}}{R_{ext}}}{\frac{V_{ref}}{R_{INT3}}}\right)$$

Equation 2
The two $V_{ref}$ terms cancel one another out. Resistor $R_{INT3}$ is preferably selected to be equal to the value of $R_{INT}$ so the $R_{INT}$ and $R_{INT3}$ terms cancel out, resulting in:

$$G_m = \frac{1}{R_{ext}}$$

Equation 3
Note that the variation of the internal resistor $R_{INT}$ is cancelled out, at least to matching constraints which are much better than absolute numbers. Advantageously, the transconductance $G_m$ of the present invention is dependant upon and controlled by the value of precision external resistor $R_{ext}$. The $G_m$ is of the present invention is independent of the internal resistance $R_{INT}$ and $R_{INT3}$. The $G_m$ is stable, remaining constant and unchanged over temperature changes, processing, and other undesired effects that may result from a non-ideal manufacturing scenario.

Figure 4:
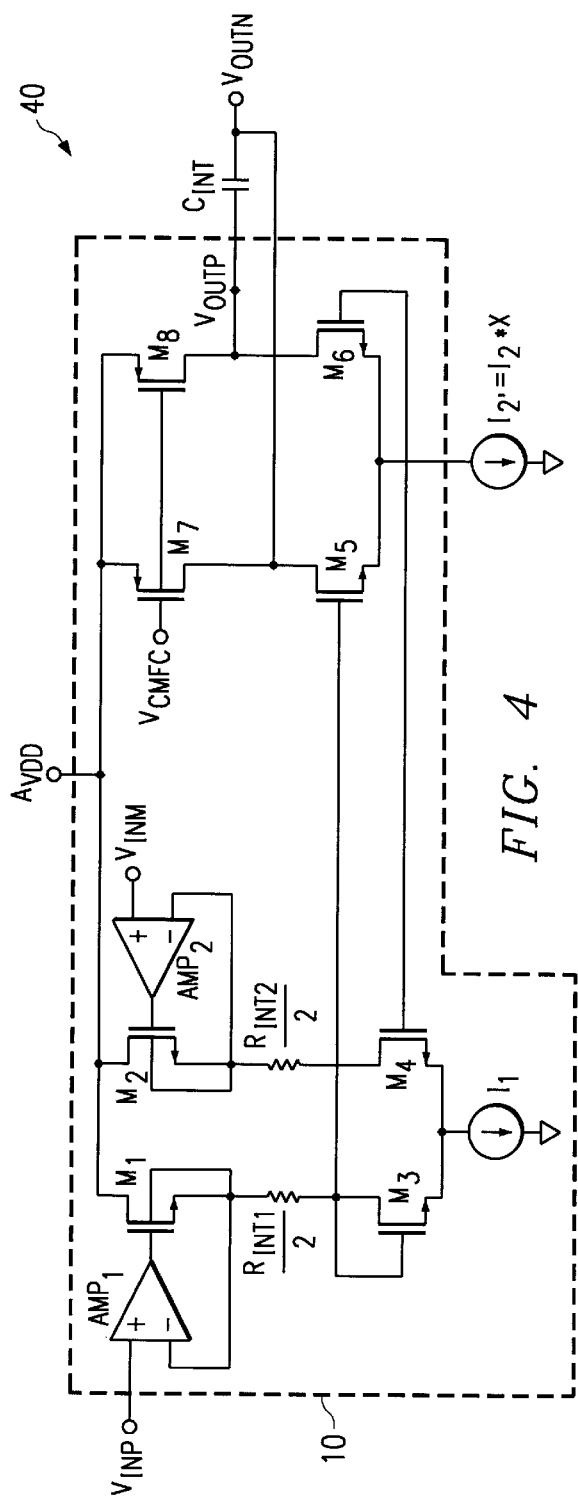
FIG. 4 shows a schematic diagram of the single stage $G_m/C$ filter of the present invention having capacitor $C_{INT}$ coupled across the output.

Frequency tuning of a $G_m/C$ requires tuning the two filter parameters, one being transconductance $G_m$ which is the inverse of resistance, and the second parameter being capacitance $C_{INT}$ which will be tuned next in accordance with the present invention. Referring to FIG. 4, the capacitive component $C_{INT}$ of a $G_m/C$ filter will be tuned by utilizing the current/capacitive relationship to scale the capacitive $C_{INT}$ variation by a current factor X, with $I_{2'}=I_2*X$. A $G_m/C$ filter 40 is shown having a transconductive stage 10 such as the one shown in FIG. 1 and an internal capacitor $C_{INT}$ coupled between the output voltages $V_{OUTP}$ and $V_{OUTN}$. Using the circuits 20 and 30 shown in FIG. 2 and 3 to tune the $G_m$, a scale factor of 1 is assumed. Assuming $I_{2'}$ is equal to $(I_2*X)$ as shown in FIG. 4, this leads to a $$G_m = \frac{X}{R_{ext}}.$$

The present invention uses this X factor to tune out the internal variation of the capacitor $C_{INT}$.

Figure 5:
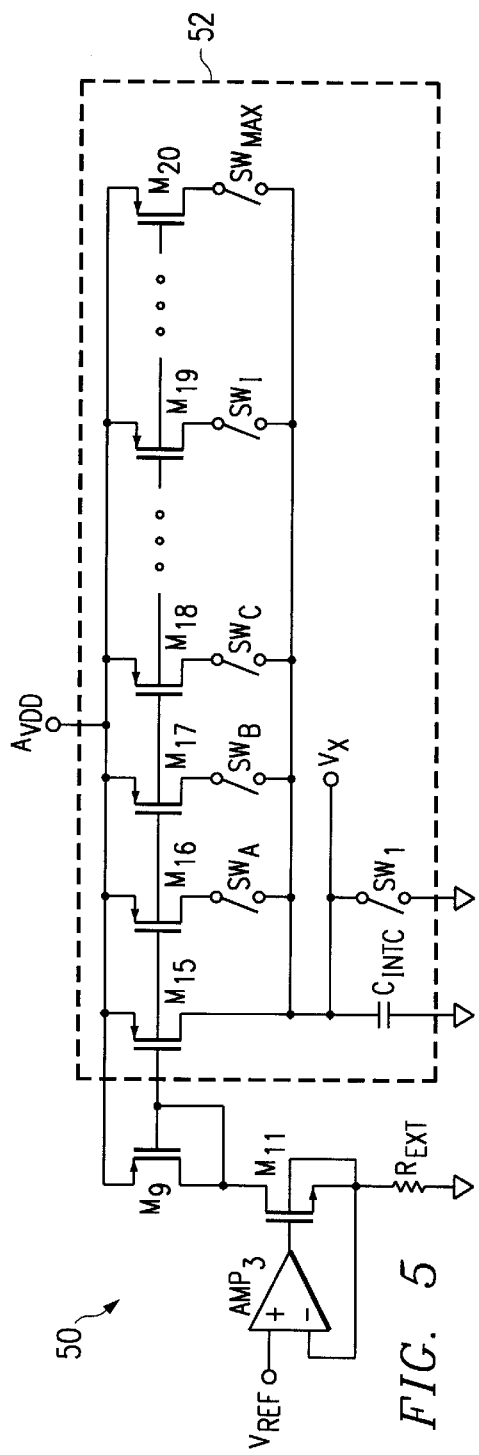
FIG. 5 shows a tuning circuit using a calibration capacitor $C_{INTC}$ to determine the error of capacitor $C_{INT}$ of the $G_m/C$ filter.

FIG. 5 shows circuit 50 comprising a tuning circuit 52 for eliminating the capacitance variation iteratively in accordance with the present invention. The tuning circuit 52 comprises a plurality of PMOS transistors M15, M16, M17, M18, M19, M20 added as an extension to the circuit 30 of FIG. 3, coupled to a voltage supply $A_{VDD}$ and coupled to switches SWA, SWB, SWC, SWI, $SW_{MAX}$ which preferably comprise transistors. Switches SWA, SWB, SWC, SWI, $SW_{MAX}$ are controlled by digital control logic 72, shown in FIG. 7. The circuit 52 may comprise additional switches and transistors, not shown. Transistors M15 through M20 may be cascoded current mirrors coupled to amplifier $Amp_3$, for example. A calibration capacitor $C_{INTC}$ is matched to capacitor $C_{INT}$ of the $G_m/C$ filter shown generally at 40 of FIG. 4 using calibration factor X which is determined by an iterative process, to be discussed further herein. A bandgap voltage $V_{ref}$ coupled with resistor $R_{ext}$ creates a current that may be flowed through the PMOS transistors M15 through M20 that is independent of temperature and process variations.

The tuning circuit 52 functions as a variable current source block in the tuning algorithm of the present invention. The calibration capacitor $C_{INTC}$ is coupled to node $V_x$ and switch SW1 at one end and to ground at the other end, for example. At the start of the iteration sequence, switch SW1 is closed and node $V_x$ is coupled to ground. Next, SW1 is opened and current is flowed through $C_{INTC}$, causing the voltage on node $V_x$ to rise linearly. Then the combination of switches SWA through $SW_{MAX}$ to be closed is determined, to match capacitance $C_{INTC}$ with capacitor $C_{INT}$ of FIG. 4.

Figure 6:
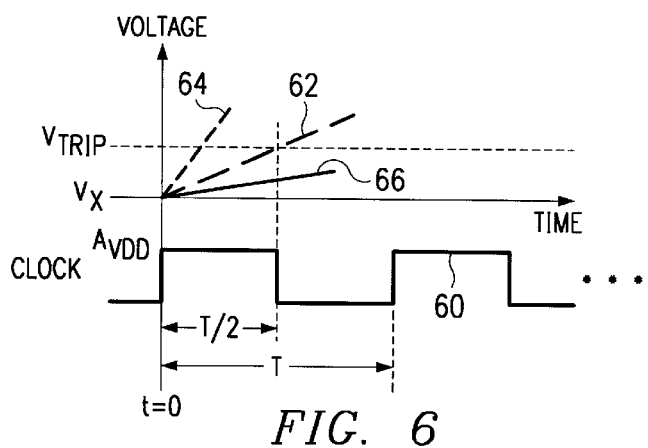
FIG. 6 illustrates a graph of voltage over time for the clock and node $V_x$ of the circuit of FIG. 5, demonstrating the iteration algorithm in a timing diagram format.

FIG. 6 is a graphical representation of an iterative process for selecting which switches SWA through $SW_{MAX}$ of FIG. 5 to close in order to calibrate capacitance $C_{INTC}$ to the capacitance desired, or $C_{IDEAL}$ ($C_{IDEAL}=C_{INT}$ of FIG. 4) in accordance with the present invention. The clock signal 60 is preferably a digital clock that is used as a time point. The clock 60 is the same as the clock used for the digital blocks or circuits on the chip, not shown. Because current into a capacitor C is equal to:

Equation 4

$$I = C\frac{dV}{dt}, \text{ or}$$

Equation 5

$$C = \frac{\Delta t * I}{\Delta V},$$

voltage trip point $V_{trip}$ is chosen from the ideal absolute value of $C_{INTC}$ of FIG. 5 which is to be matched 1:1 (rather than absolute) to the filter $C_{INT}$ of FIG. 4, or:

$$\Delta V = V_{trip} = I_{2'}\left(\frac{\Delta t}{C_{ideal}}\right)$$

Equation 6
where $I_{2'}$ is based off well-controlled resistance $R_{ext}$, $\Delta t$ is well-controlled and based off clock rate 60 which may be T/2, for example, and $C_{ideal}$ is the tuned capacitance $C_{INT}$ desired. Therefore, voltage $V_{trip}$ is a voltage of a precise amount.

Digital control logic 72 is preferably configured to perform a successive approximation to tune the $G_m/C$ circuit 40 faster than in the prior art, using fewer clock 60 cycles T. The voltage at node $V_x$ charges linearly when the constant current is applied to capacitor $C_{INTC}$. When current is driven through the transistors M15 through M20, the voltage at node $V_x$ charges from approximately zero voltage, or ground, at time t=0. Note that switch SW1 is not able to discharge node $V_x$ to exactly zero volts, which may be compensated for in the final value of voltage $V_{trip}$.

The calibration iteration algorithm illustrated in the timing diagram of FIG. 6 will next be described. If $C_{INTC}$ is equal to the ideal capacitance $C_{ideal}$ (signal 62), then the voltage at node $V_x$ reaches exactly voltage $V_{trip}$ exactly at the end of the time period $\Delta t$ (T/2). This is the goal of the calibration scheme of the present invention. However, it is likely to take several iterations to achieve this. If capacitance $C_{INTC}$ is too small, the slope of the voltage signal $V_x$ (64) is too steep, and node $V_x$ reaches voltage $V_{trip}$ before time period $\Delta t$ is completed. Referring to FIG. 5, the current is made smaller by opening more switches SWA–$SW_{MAX}$ in order to lower the slope of the curve 64 to reach the ideal curve 62 which is a reflection of $C_{IDEAL}$. Conversely, if $C_{INTC}$ is too large due to process variations, then voltage $V_x$ will not be able to reach $V_{trip}$ in a given time period $\Delta t$.

Figure 7:
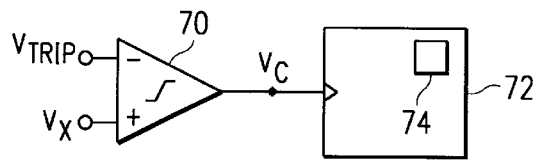
FIG. 7 is a block diagram of a low offset comparator used to generate voltage $V_c$.

A low offset comparator 70 such as the one shown in FIG. 7 may be used in conjunction with digital circuitry 72 comprising the algorithm 74 for tuning $C_{INT}$, for example. The comparator 70 is preferably a low offset comparator without hysteresis. Referring again to Equation 6:

$$\Delta V = V_{trip} = I_{2'}\left(\frac{\Delta t}{C_{ideal}}\right)$$

Equation 6
The points $V_{trip}$ or $\Delta V$, and $\Delta t$ are fixed. $C_{ideal}$ is also fixed because it is a fixed capacitor in the circuit 52. Therefore, there is only one value of current $I_{2'}$ that results in signal 62 of FIG. 6 which corresponds to $C_{ideal}$. The $I_{2'}$ and $C_{ideal}$ combination determines the slopes of the lines 62, 64 and 66 of FIG. 6. The comparator 70 detects the point where the voltage $V_x$ of capacitor $C_{INTC}$ is either larger or smaller than voltage $V_{trip}$. The comparator 70 compares voltages $V_{trip}$ and $V_x$, with the output being voltage $V_c$ that is coupled to and adapted to serve as a control signal for digital circuitry 72. When voltage $V_c$ goes high or low either too quickly or too slowly with respect to the clock signal 60, the digital circuitry 72 comprises algorithm 74 being adapted to control switches SWA, SWB, SWC, SWI, $SW_{MAX}$ of FIG. 5, opening or closing them in an iterative fashion until the desired $C_{ideal}$ is achieved. The drain-source voltage of the comparator 70 may be sampled to obtain a more accurate result, but the concepts are the same.

Figure 8:
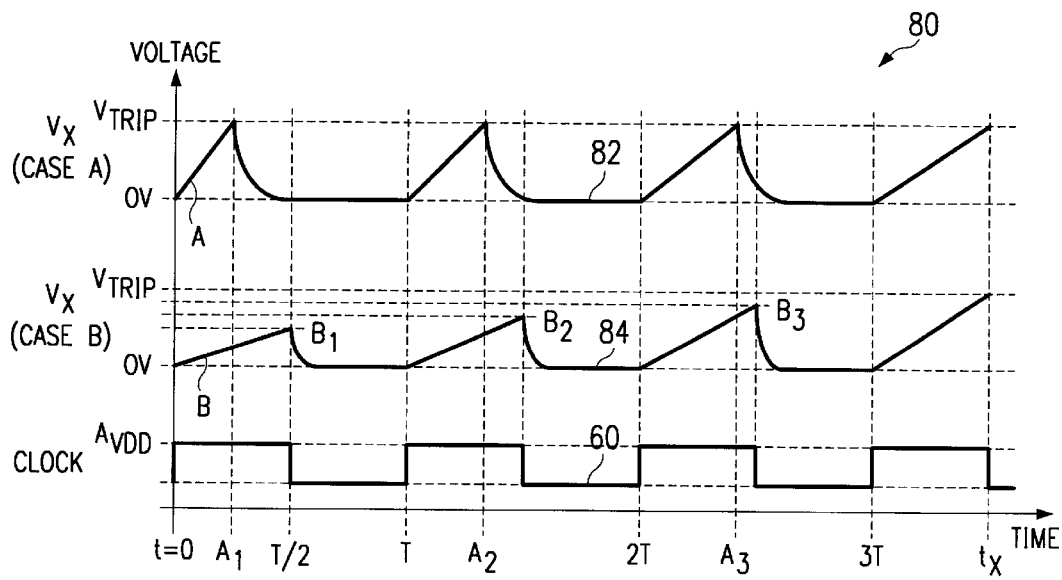
FIG. 8 is exemplary of a graph of voltage vs. time for $V_x$ for case A and case B with respect to the clock signal.

FIG. 8 illustrates two cases for tuning $C_{INTC}$, Case A, where $I_{2'}$ is decreased to simulate increasing $C_{INTC}$, and Case B, where $I_{2'}$ is increased to simulate decreasing $C_{INTC}$. Case A is represented by signal A, starting with the 1:1 case of $C_{INT}=C_{IDEAL}$, with switches SWA through SWI of FIG. 5 being closed. At time T/2, appropriate blocks power down, the clock 60 stops, and current $I_{2'}$ is sent to the $G_m$ block 40. If voltage $V_x$ reaches $V_{trip}$ at time $A_1$ before the end of $\Delta t$, then capacitor $C_{INTC}$ is smaller than desired, so the algorithm 74 selects:

$$\frac{(n-1)}{n}$$

Equation 7
of the current sources, selected by opening one of the switches SWA through SWI, to reduce the current $I_{2'}$ in the next cycle. The value of "n" represents the number of switches and corresponding transistors M15 through M20 are required in the tuning circuit 52, "n" being determined by the $C_{INTC}$ resolution desired. For example, n=128 for a +/−0.7874% resolution. Next, if the equation:

$$\frac{(n-1)}{n} * I_{2'}$$

Equation 8
makes $V_x > V_{trip}$ in $\Delta t$, e.g. voltage $V_x$ reaches $V_{trip}$ before the end of $\Delta t$ of the next cycle, the iteration is repeated, continuing until the optimal set of switches is selected, and the scale factor X has been determined, shown in FIG. 8 at time $t_x$. Note that at the curve at 82, switch SW1 pulls voltage $V_x$ low again.

Case A represents the situation where X<1 and $C_{INTC}$ was smaller than ideal. Once calibration is over at time $t_x$, the tuning components, for example, comparator 70 and amplifier $Amp_4$ of FIG. 3 are no longer required and may be powered down, saving operational current. Case B illustrates the alternative situation, where $C_{INTC}$ is larger than ideal. If voltage $V_x$ reaches the end of $\Delta t$ before reaching voltage $V_{trip}$, e.g. only reaches voltage level $B_1$ by the end of $\Delta t$, then $C_{INTC}$ is larger than desired, so the algorithm 74 selects:

$$\frac{(n+1)}{n}$$

Equation 9
and the next cycle, the circuit 40 selects:

$$\frac{(n+1)}{n} * I_{2'}$$

Equation 10
Note that at the curve at 84, switch SW1 pulls voltage $V_x$ low again. The procedure is repeated until voltage $V_x$ reaches voltage $V_{trip}$ within a time period $\Delta t$, at time $t_x$. The scale factor X is >1 in this situation. As in Case A, once calibration is over at time $t_x$, the tuning components are no longer required and may be powered down, saving operational current. In both Cases and A and B, the current $I_{2'}$ is supplied to the $G_m$ blocks of FIG. 4 to fully tune the $G_m/C$ filter 40.

The present algorithm to calibrate the internal capacitance $C_{INTC}$ completely to output capacitor $C_{INT}$ to within +/−0.78% takes at most, about 40 cycles, but will take fewer cycles the better the process is controlled. These estimates are related to tuning the $C_{INTC}$ over a +/−30% range, with the +/−0.78% as a resolution. Alternatively, a digital algorithm using a successive approximation technique may be used to minimize the number of clock cycles needed to tune the filter.

A few factors that can limit the tuning performance because of analog inaccuracies are enumerated herein. First, the clock jitter/duty cycle: because tuning relies on a given $\Delta t$, any error in this time will directly affect the final value. Because this is a digital issue, the system clock is usually well controlled. Second, the comparator 70 offset may add to the error seen as Vtrip ideal +/−$\Delta c$. A low offset comparator may be utilized, or an initial step sampling the offset and modulating $V_{trip}$ may be employed, which is more complicated but would implement a tight tolerance tuning. Furthermore, using a cascoding current sources used for measurement phases would optimize the performance of current sources of tuning circuit. Using cascoded current sources should not pose a problem for an analog process with reasonable head room ($V_{supply}$=2.7 V). Also, the inherent matching of internal resistors to internal resistors, and internal capacitors to internal capacitors should be achievable in even the most stringent tuning requirements.

The present invention provides many advantages over prior art tuning methods and circuits. Once the $G_m$ and $C_{INT}$ are calibrated, the tuning circuit components shut off and do not utilize any more operational current, saving power and thereby increasing battery life. The switches of the tuning circuit 52 are set to the correct value at start-up, and after the calibration algorithm 74 is complete, bias current $I_2$, remains constant to the $G_m/C$ filter. This feature provides advantages over prior art PLLs and tuning circuits that require continuous current. Also, the circuits of the present invention require very little semiconductor area, compared to other tuning schemes which require large cells. Very little additional circuitry is required with most of the circuits already existing in a typical $G_m/C$ filter. For example, the circuit 30 of FIG. 3, the tuning circuit 52 comprising a variable current source block, and the algorithm 74 in the digital circuitry 72 are the only additional components of the present invention. Furthermore, the on-chip algorithm and circuit for tuning a $G_m/C$ filter described has no detrimental dynamic effects on the filter circuitry, and tuning is completed in fewer clock cycles than in prior art circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, FIGS. 2 and 3 are merely exemplary of circuits 20 and 30 that may be used to generate currents $I_1$ and $I_2$. Other circuits servicing to eliminate the dependence of $G_m$ on $R_{INT}$ and create the relationship $G_m=1/R_{ext}$ may be utilized. Likewise, the tuning circuit 52 may comprise any type of circuit capable of iteratively tuning the capacitance $C_{INT}$ of the $G_m/C$ filter by compensating a calibration capacitor $C_{INTC}$ with a current. The $G_m/C$ filter circuit of the present invention may be utilized in a wide variety of applications, such as telecommunications applications, mobile devices and systems, laptops and personal computers, mixed signal and analog devices, and any lower power electrical application, in general.

What is claimed is:

1. A method of tuning a $G_m/C$ filter having a transconductive $G_m$ stage and a variable output capacitor, said variable output capacitor having a variable current source, and a first and second circuit portion, said first circuit portion comprises a plurality of transistors coupled to a plurality of switches, said transistors coupled to said variable current source, said transistors and switches coupled to a calibration capacitor, said second circuit portion having an algorithm for iteratively selecting said transistors and switches to tune said $G_m/C$ filter, said method comprising the steps of:

calibrating said calibration capacitor iteratively with said variable current source to tune said $G_m/C$ filter;

powering off said first and second circuit portions after said calibration step; and tuning said calibration capacitor to vary the capacitance of said variable output capacitor with said variable current source.

2. The method of claim 1 wherein said second circuit portion comprises digital control circuitry.

3. A method of tuning a $G_m/C$ filter having a transconductive $G_m$ stage and an output capacitor, said output capacitor comprises a first circuit portion having transistors and switches, a variable current source and a calibration capacitor, said output capacitor further comprises a second circuit portion having an algorithm for iteratively selecting said transistors and switches to tune said output capacitor, said method comprising the steps of:

establishing a bias current with an external precision resistor, the transconductance $G_m$ of said $G_m/C$ filter being a function of said external precision resistor;

powering off said first circuit portion after said calibration step; and scaling said bias current with a scaling factor, said scaling factor said scaling factor calibrates the $G_m/C$ filter output capacitor.

4. The method of claim 3 wherein $G_m/C$ filter comprises digital circuitry, said digital control circuitry including said iterative algorithm.

5. The method of claim 3 wherein said wherein said scaling factor is determined by said iterative algorithm.

6. A tuning circuit for a $G_m/C$ filter having a transconductance and a variable output capacitor, said variable output capacitor comprising:

a first circuit portion comprises a variable current source, a plurality of transistors coupled to a plurality of switches, said transistors coupled to variable current source, said transistors and switches coupled to a calibration capacitor, said variable current source is coupled to compensate said calibration capacitor; and a second circuit portion coupled to said first circuit portion, said second circuit portion comprising digital control circuitry, said digital control circuitry comprising an algorithm for iteratively selecting said transistors and switches to tune said $G_m/C$ filter, wherein said first circuit portion is powered off after said tuning of said $G_m/C$ filter.

* * * * *